US012543599B2

(12) United States Patent
Patil et al.

(10) Patent No.: US 12,543,599 B2
(45) Date of Patent: Feb. 3, 2026

(54) PACKAGE COMPRISING A FIRST SUBSTRATE, A SECOND SUBSTRATE AND AN ELECTRICAL DEVICE COUPLED TO A BOTTOM SURFACE OF THE SECOND SUBSTRATE

(71) Applicant: QUALCOMM Incorporated, San Diego, CA (US)

(72) Inventors: Aniket Patil, San Diego, CA (US); Brigham Navaja, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 655 days.

(21) Appl. No.: 17/889,163

(22) Filed: Aug. 16, 2022

(65) Prior Publication Data
US 2024/0063195 A1 Feb. 22, 2024

(51) Int. Cl.
*H01L 25/16* (2023.01)
*H01L 23/00* (2006.01)
*H01L 23/498* (2006.01)

(52) U.S. Cl.
CPC ...... *H01L 25/162* (2013.01); *H01L 23/49816* (2013.01); *H01L 23/49833* (2013.01); *H01L 23/49838* (2013.01); *H01L 24/16* (2013.01); *H01L 24/32* (2013.01); *H01L 24/48* (2013.01); *H01L 24/73* (2013.01); *H01L 2224/16227* (2013.01); *H01L 2224/32225* (2013.01); *H01L 2224/48227* (2013.01); *H01L 2224/73265* (2013.01); *H01L 2924/182* (2013.01); *H01L 2924/19041* (2013.01); *H01L 2924/19042* (2013.01)

(58) Field of Classification Search
CPC ............ H01L 25/162; H01L 23/49816; H01L 23/49833
See application file for complete search history.

(56) References Cited

U.S. PATENT DOCUMENTS 8,102,032 B1 * 1/2012 Bolognia ............ H01L 23/3128
257/659
2014/0313681 A1 10/2014 Yamano et al.
2019/0088621 A1 3/2019 Yang et al.

OTHER PUBLICATIONS

International Search Report and Written Opinion—PCT/US2023/070055—ISA/EPO—Nov. 14, 2023.

* cited by examiner

*Primary Examiner* — Errol V Fernandes
(74) *Attorney, Agent, or Firm* — Loza & Loza, LLP

(57) ABSTRACT

A package comprising a first substrate, a first integrated device coupled to the first substrate, a second substrate coupled to the first substrate through a first plurality of solder interconnects such that the first integrated device is located between the first substrate and the second substrate, wherein the second substrate includes a first surface and a second surface, an electrical device coupled to a second surface of the second substrate such that the electrical device is located between the first substrate and the second substrate, and an encapsulation layer coupled to the first substrate and the second substrate. The encapsulation layer is located between the first substrate and the second substrate. The encapsulation layer encapsulates the first integrated device and the electrical device.

22 Claims, 12 Drawing Sheets

BOTTOM SUBSTRATE

PLAN VIEW

AA CROSS SECTIONAL
PROFILE VIEW

BB CROSS SECTIONAL
PROFILE VIEW

PACKAGE COMPRISING A FIRST SUBSTRATE, A SECOND SUBSTRATE AND AN ELECTRICAL DEVICE COUPLED TO A BOTTOM SURFACE OF THE SECOND SUBSTRATE

FIELD

Various features relate to packages with substrates and integrated devices.

BACKGROUND

A package may include a substrate and integrated devices. These components are coupled together to provide a package that may perform various electrical functions. There is an ongoing need to provide better performing packages and reduce the overall size of the packages.

SUMMARY

Various features relate to packages with substrates and integrated devices.

One example provides a package comprising a first substrate, a first integrated device coupled to the first substrate, a second substrate coupled to the first substrate through a first plurality of solder interconnects such that the first integrated device is located between the first substrate and the second substrate, wherein the second substrate includes a first surface and a second surface, an electrical device coupled to a second surface of the second substrate such that the electrical device is located between the first substrate and the second substrate, and an encapsulation layer coupled to the first substrate and the second substrate. The encapsulation layer is located between the first substrate and the second substrate. The encapsulation layer encapsulates the first integrated device and the electrical device.

Another example provides a package comprising a first substrate, a first integrated device coupled to the first substrate, a second substrate coupled to the first substrate through a first plurality of solder interconnects such that the first integrated device is located between the first substrate and the second substrate, wherein the second substrate includes a first surface and a second surface, a passive device coupled to the second surface of the second substrate such that the passive device is located between the first substrate and the second substrate, and an encapsulation layer coupled to the first substrate and the second substrate. The encapsulation layer is located between the first substrate and the second substrate. The encapsulation layer encapsulates the first integrated device and the passive device.

Another example provides a package comprising a first substrate, a first integrated device coupled to the first substrate, a second substrate coupled to the first substrate through a first plurality of solder interconnects such that the first integrated device is located between the first substrate and the second substrate, wherein the second substrate includes a first surface and a second surface, a second integrated device coupled to the second surface of the second substrate such that the second integrated device is located between the first substrate and the second substrate, and an encapsulation layer coupled to the first substrate and the second substrate. The encapsulation layer is located between the first substrate and the second substrate. The encapsulation layer encapsulates the first integrated device and the second integrated device.

Another example provides a method for fabricating a package. The method provides a second substrate that includes a first surface and a second surface. The method couples an electrical device to the second surface of the second substrate. The method couples a first plurality of solder interconnects to the second surface of the second substrate. The method provides a first substrate and a first integrated device coupled to the first substrate. The method couples the second substrate to the first substrate through the first plurality of solder interconnects such that the first integrated device and the electrical device are located between the first substrate and the second substrate. The method forms an encapsulation layer between the first substrate and the second substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a first substrate, a first integrated device coupled to the first substrate, a second substrate coupled to the first substrate through a first plurality of solder interconnects such that the first integrated device is located between the first substrate and the second substrate, wherein the second substrate includes a first surface and a second surface, an electrical device coupled to a second surface of the second substrate such that the electrical device is located between the first substrate and the second substrate, and an encapsulation layer coupled to the first substrate and the second substrate. The encapsulation layer is located between the first substrate and the second substrate. The encapsulation layer encapsulates the first integrated device and the electrical device. The electrical device may include a passive device, an active device, a chiplet, and/or an integrated device. As will be further described below, the position and the location of the electrical device may help improve the performance of the package.

Exemplary Packages Comprising Substrates and an Electrical Device

Figure 1:
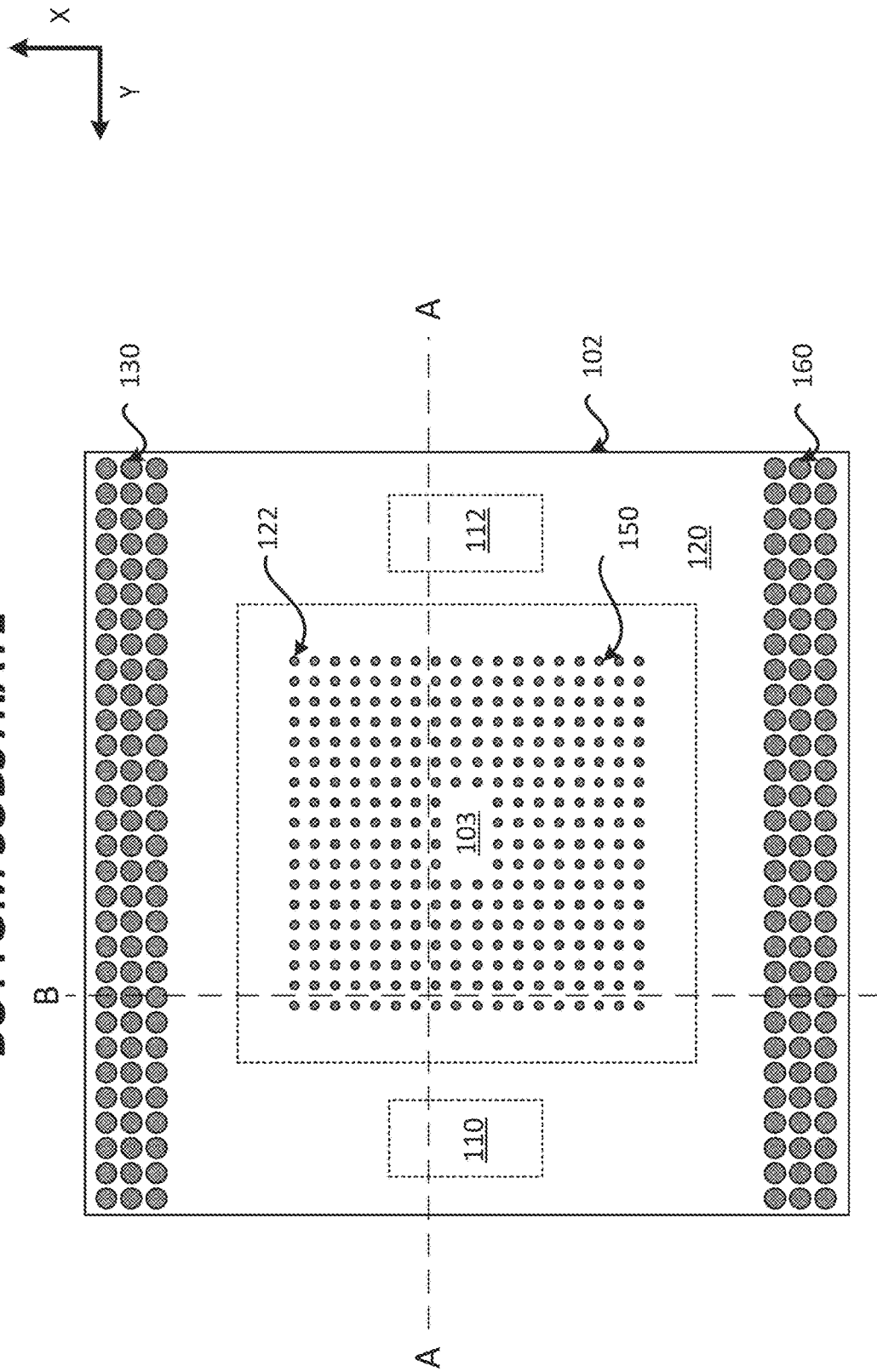
FIG. 1 illustrates an exemplary plan view of a substrate of a package.

FIG. 1 illustrates a plan view of a substrate 102. As will be further described below, the substrate 102 may be a bottom substrate (e.g., first substrate) of a package. The substrate 102 includes at least one dielectric layer 120 and a plurality of interconnects 122. The plurality of interconnects 122 includes a plurality of pad interconnects 130, a plurality of pad interconnects 160 and a plurality of pad interconnects 150. The plurality of pad interconnects 130 may be located along an edge (e.g., first edge of the substrate) of a periphery of the substrate 102. The plurality of pad interconnects 160 may be located along an edge (e.g., second edge of the substrate) of a periphery of the substrate 102. The second edge of the substrate 102 may be opposite to the first edge of the substrate 102.

FIG. 1 also illustrate an integrated device 103, an electrical device 110 and an electrical device 112. As will be further described below, when implemented within a package, the integrated device 103, the electrical device 110 and the electrical device 112 may vertically overlap with the substrate 102. However, the integrated device 103, the electrical device 110 and the electrical device 112 may not vertically overlap with the plurality of pad interconnects 130 and the plurality of pad interconnects 160. The plurality of pad interconnects 150 may vertically overlap with the integrated device 103. The integrated device 103 may be configured to be coupled to the plurality of pad interconnects 150 of the substrate 102. As will be further described below, in some implementations, the plurality of pad interconnects 130 and the plurality of pad interconnects 160 may be configured to be coupled to a plurality of solder interconnects. FIG. 1 may illustrate a top metal layer of a bottom substrate of a package. That is, the interconnects and/or the pad interconnects that are shown in FIG. 1, may illustrate interconnects and/or pad interconnects that may be located on a top metal layer of the substrate 102. The top metal of the substrate 102 may represent a first metal layer (e.g., M1) of the substrate 102.

Figure 2:
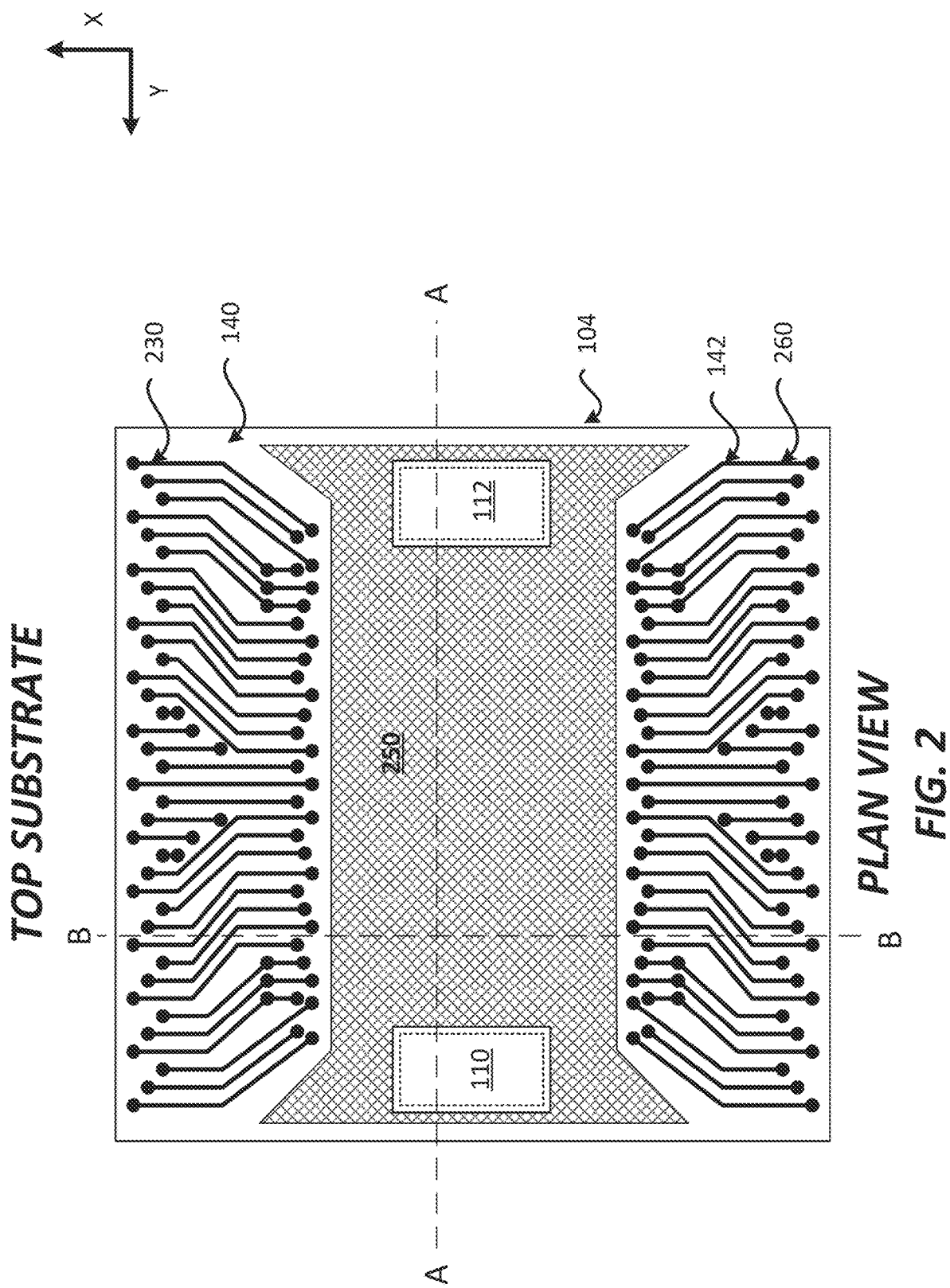
FIG. 2 illustrates an exemplary plan view of another substrate of a package.

FIG. 2 illustrates a plan view of a substrate 104. As will be further described below, the substrate 104 may be a top substrate (e.g., second substrate) of a package. The substrate 104 includes at least one dielectric layer 140 and a plurality of interconnects 142. The plurality of interconnects 142 includes a plurality of interconnects 230, a plurality of interconnects 260 and at least one plane interconnect 250. The at least one plane interconnect 250 may be configured to provide an electrical path for ground.

FIG. 2 may illustrate a metal layer of a top substrate of a package. For example, the interconnects that are shown in FIG. 1, may illustrate interconnects that may be located on a bottom metal layer of the substrate 104 or a next to bottom metal layer of the substrate 104.

FIG. 2 also illustrate the integrated device 103, the electrical device 110 and the electrical device 112. As will be further described below, when implemented within a package, the integrated device 103, the electrical device 110 and the electrical device 112 may vertically overlap with the substrate 104. However, the integrated device 103, the electrical device 110 and the electrical device 112 may not vertically overlap with the plurality of interconnects 230 and the plurality of interconnects 260. The at least one plane interconnect 250 may or may not vertically overlap with the integrated device 103.

Figure 3:
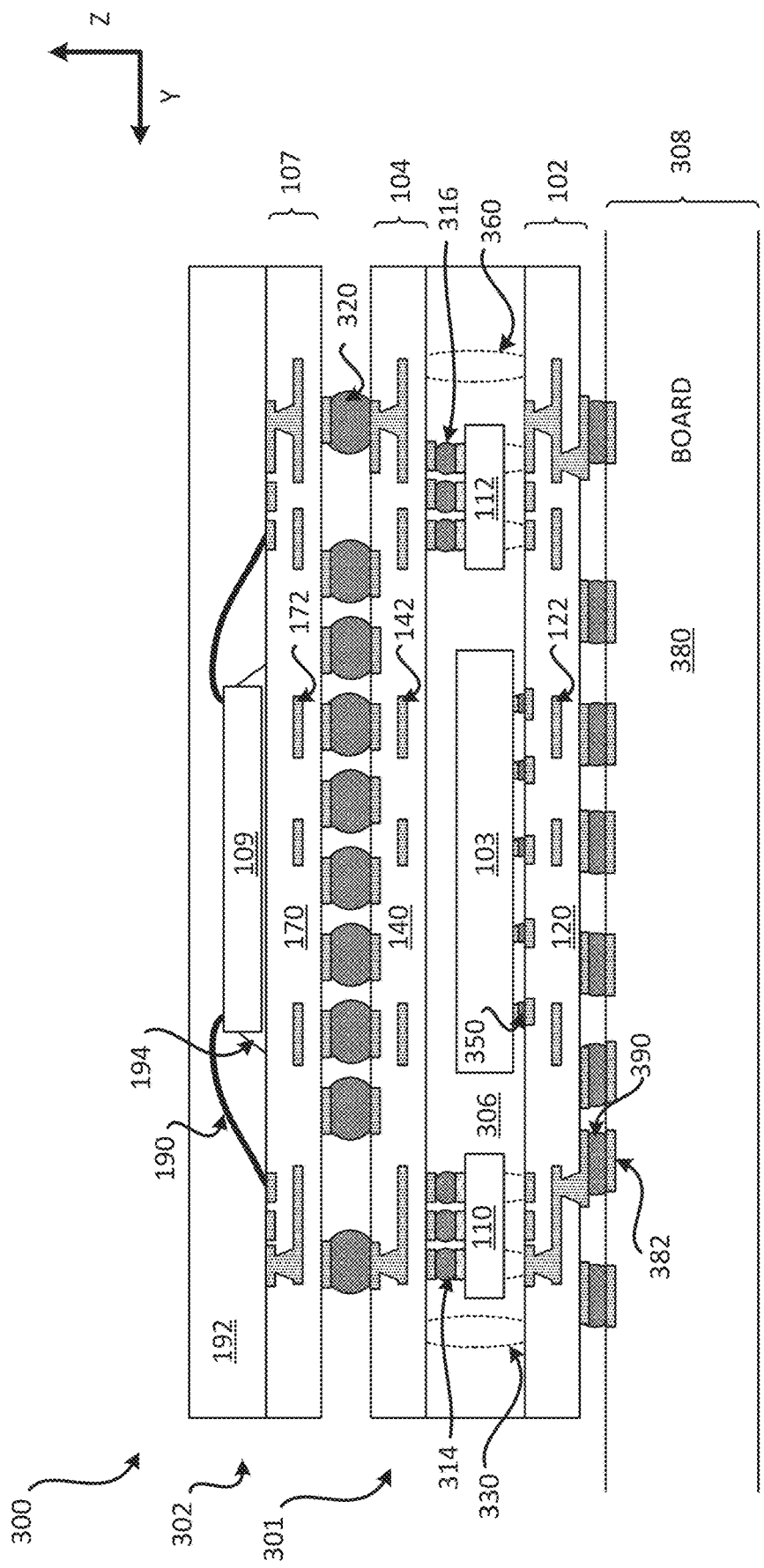
FIG. 3 illustrates an exemplary cross sectional profile view of a package that includes a substrate and at least one electrical device.

FIG. 3 illustrates a cross sectional profile view of a package 300 that includes substrates and at least one electrical device. The cross sectional profile view shown may be across an AA cross section as shown in FIGS. 1 and 2. The package 300 may include a package on package (PoP). The package 300 may include a package 301 and a package 302. The package 301 may be a first package. The package 301 may be a bottom package. The package 302 may be a second package. The package 302 may be a top package. The package 302 is coupled to the package 301 through a plurality of solder interconnects 320. The package 300 is coupled to a board 308 through a plurality of solder interconnects 390. The board 308 includes at least one board dielectric layer 380 and a plurality of board interconnects 382. The board 308 may include a printed circuit board (PCB). The plurality of solder interconnects 390 are coupled to the plurality of board interconnects 382 and the plurality of interconnects 122.

The package 302 includes a substrate 107, an integrated device 109 and an encapsulation layer 192. The substrate 107 includes at least one dielectric layer 170 and a plurality of interconnects 172. The integrated device 109 is coupled to the substrate 107. An adhesive 194 may be used to couple a back side of the integrated device 109 to the substrate 107. The back side of the integrated device 109 faces the substrate 107. A front side of the integrated device 109 faces away from the substrate 107. The integrated device 109 is configured to be electrically coupled to the substrate 107 through a plurality of wire bonds 190. The plurality of wire bonds 190 are coupled to the integrated device 109 and the plurality of interconnects 172. The encapsulation layer 192 encapsulates the integrated device 109, the plurality of wire bonds and the adhesive 194. The encapsulation layer 192 may be coupled to the integrated device 109, the plurality of wire bonds 190 and a surface of the substrate 107.

The package 301 includes the substrate 102, the substrate 104, the integrated device 103, the electrical device 110, the electrical device 112, and an encapsulation layer 306. The substrate 102 includes at least one dielectric layer 120 and the plurality of interconnects 122. The plurality of interconnects 122 may include the plurality of pad interconnects 130, the plurality of pad interconnects 150 and the plurality of pad interconnects 160, as described in at least FIG. 1. The integrated device 103 is coupled to the substrate 102 through a plurality of solder interconnects 350. The integrated device 103 may be coupled to the substrate 102 through a plurality of pillar interconnects and the plurality of solder interconnects 350. A front side of the integrated device 103 faces the substrate 102. A back side of the integrated device 103 faces the substrate 104.

The substrate 104 includes at least one dielectric layer 140 and the plurality of interconnects 142. The plurality of interconnects 142 may include the plurality of interconnects 230, the plurality of interconnects 260 and the at least one plane interconnect 250, as described in at least FIG. 2. The electrical device 110 is coupled to the substrate 104 through a plurality of solder interconnects 314. For example, the electrical device 110 may be coupled to a bottom side (e.g., bottom surface) of the substrate 104 through the plurality of solder interconnects 314. The electrical device 110 may include a front side and a back side. In some implementations, the front side of the electrical device 110 may face the substrate 104, and the back side of the electrical device 110 may face the substrate 102. For example, when the electrical device 110 is an integrated device or a chiplet, the front side of the integrated device or the chiplet may face the substrate 104, and the back side of the integrated device or the chiplet may face the substrate 102. The electrical device 110 is coupled to the plurality of interconnects 142 through the plurality of solder interconnects 314. The electrical device 112 is coupled to the substrate 104 through a plurality of solder interconnects 316. For example, the electrical device 112 may be coupled to a bottom side (e.g., bottom surface) of the substrate 104 through the plurality of solder interconnects 316. The electrical device 112 may include a front side and a back side. In some implementations, the front side of the electrical device 112 may face the substrate 104 and the back side of the electrical device 112 may face the substrate 102. For example, when the electrical device 112 is an integrated device or a chiplet, the front side of the integrated device or the chiplet may face the substrate 104, and the back side of the integrated device or the chiplet may face the substrate 102. The electrical device 112 is coupled to the plurality of interconnects 142 through the plurality of solder interconnects 316.

The integrated device 103, the electrical device 110, the electrical device 112 are located between the substrate 102 and the substrate 104. The encapsulation layer 306 encapsulates the integrated device 103, the electrical device 110 and the electrical device 112. The encapsulation layer 306 is located between the substrate 102 and the substrate 104. The encapsulation layer 306 is coupled to the substrate 102 and the substrate 104. For example, the encapsulation layer 306 may be coupled to a first surface (e.g., top surface) of the substrate 102 and a second surface (e.g., bottom surface) of the substrate 104. The encapsulation layer 306 may include a mold, a resin and/or an epoxy. The encapsulation layer 306 may be a means for encapsulation. The encapsulation layer 306 may be provided by using a compression and transfer molding process, a sheet molding process, or a liquid molding process.

As will be further described below in at least FIG. 4, a plurality of solder interconnects 330 and a plurality of solder interconnects 360 are coupled to the substrate 102 and the substrate 104. The plurality of solder interconnects 330 and the plurality of solder interconnects 360 may be located along a periphery of the package 300. The plurality of solder interconnects 330 and the plurality of solder interconnects 360 may be coupled to the plurality of interconnects 122 of the substrate 102 and the plurality of interconnects 142 of the substrate 104. The plurality of solder interconnects 330 and the plurality of solder interconnects 360 may be located in the encapsulation layer 306. Thus, the encapsulation layer 306 may encapsulate the plurality of solder interconnects 330 and the plurality of solder interconnects 360.

As mentioned above, the package 302 is coupled to the package 301 through a plurality of solder interconnects 320. The plurality of solder interconnects 320 are located between the substrate 104 and the substrate 107. The plurality of solder interconnects 320 are coupled to the plurality of interconnects 172 of the substrate 107 and the plurality of interconnects 142 of the substrate 104.

The electrical device 110 and/or the electrical device 112 may include a passive device and/or an active device. For example, the electrical device 110 and/or the electrical device 112 may include a capacitor and/or an inductor. The electrical device 110 and/or the electrical device 112 may include a trench capacitor (e.g., deep trench capacitor formed in a silicon die). The electrical device 110 and/or the electrical device 112 may include an integrated device and/or a chiplet. The electrical device 110 and/or the electrical device 112 may include a silicon die. As mentioned above, the electrical device 110 and/or the electrical device 112 may be coupled to the substrate 104 such that the front side of the electrical device 110 and/or the front side of the electrical device 112 faces the substrate 104. The electrical device 110 and/or the electrical device 112 may be configured to be electrically coupled to a power distribution network (PDN). The electrical device 110 and/or the electrical device 112 may be configured to be electrically coupled to power and/or ground.

Figure 4:
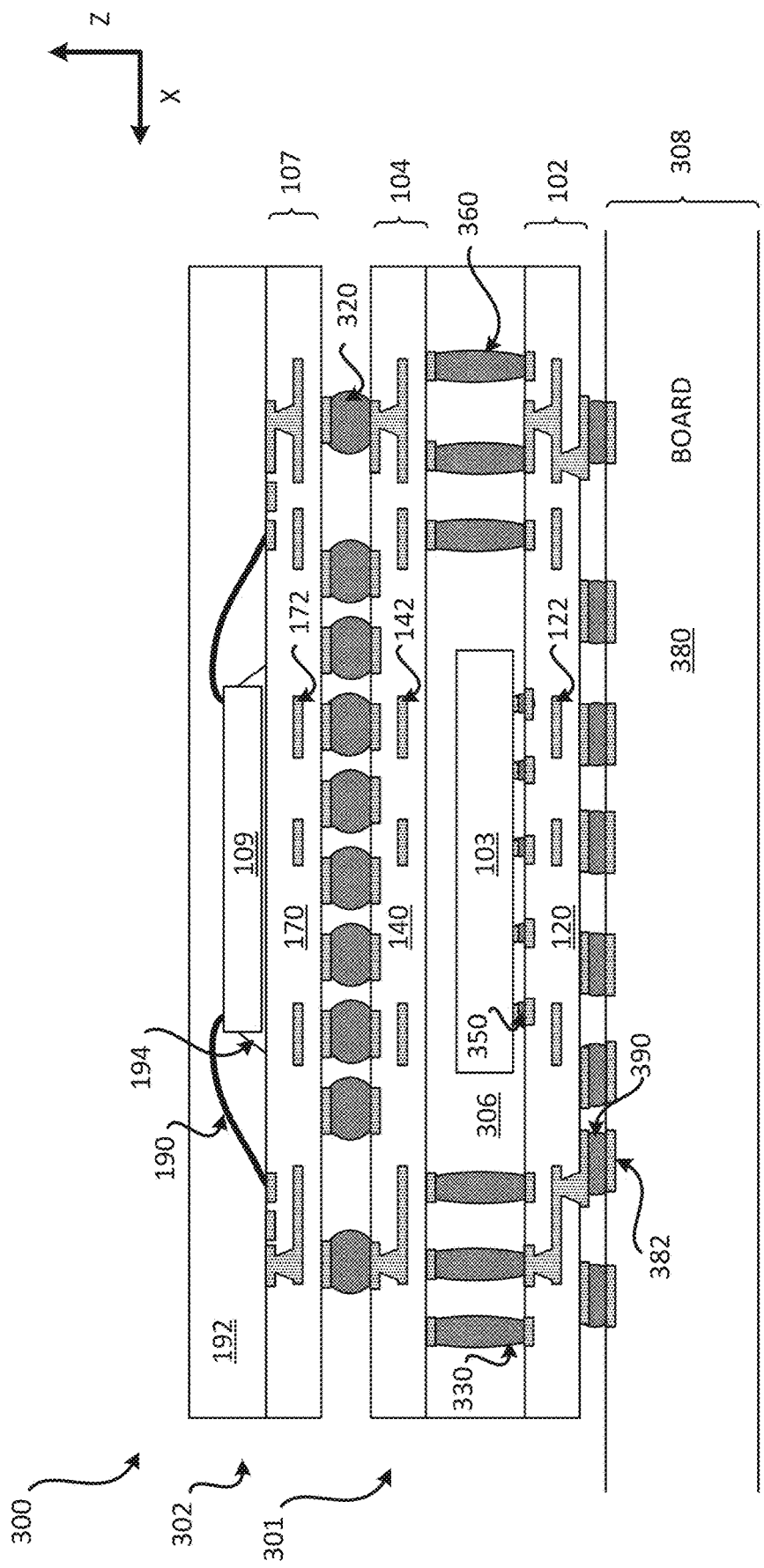
FIG. 4 illustrates an exemplary cross sectional profile view of a package that includes a substrate and at least one electrical device.

FIG. 4 illustrates a cross sectional profile view of the package 300 that includes substrates and at least one electrical device. The cross sectional profile view shown may be across a BB cross section as shown in FIGS. 1 and 2.

As shown in FIG. 4, the package 300 may include a package 301 and a package 302. The package 301 includes the substrate 102, the substrate 104, the integrated device 103, the plurality of solder interconnects 330, the plurality of solder interconnects 360 and the encapsulation layer 306. The package 301 also includes the electrical device 110 and the electrical device 112, which are shown and described in at least FIG. 3.

The plurality of solder interconnects 330 may be configured to be coupled to the plurality of pad interconnects 130, as shown and described in FIG. 1. The plurality of solder interconnects 360 may be configured to be coupled to the plurality of pad interconnects 160, as shown and described in FIG. 1. The plurality of pad interconnects 130 and the plurality of pad interconnects 160 may be part of the plurality of interconnects 122 of the substrate 102.

The integrated device 103 is configured to be electrically coupled to the electrical device 110 and/or the electrical device 112. For example, the integrated device 103 is configured to be electrically coupled to the electrical device 110 through at least one electrical path that includes (i) at least one solder interconnect from the plurality of solder interconnects 350, (ii) at least one interconnect from the plurality of interconnects 122, (iii) at least one solder interconnect from the plurality of solder interconnects 330, (iv) at least one interconnect from the plurality of interconnects 142, and (v) at least one solder interconnect from the plurality of solder interconnects 314.

In some implementations, the integrated device 103 is configured to be electrically coupled to the electrical device 110 through at least one electrical path that includes (i) at least one solder interconnect from the plurality of solder interconnects 350, (ii) at least one interconnect from the plurality of interconnects 122, (iii) at least one solder interconnect from the plurality of solder interconnects 360, (iv) at least one interconnect from the plurality of interconnects 142, and (v) at least one solder interconnect from the plurality of solder interconnects 314.

In some implementations, the integrated device 103 is configured to be electrically coupled to the electrical device 112 through at least one electrical path that includes (i) at least one solder interconnect from the plurality of solder interconnects 350, (ii) at least one interconnect from the plurality of interconnects 122, (iii) at least one solder interconnect from the plurality of solder interconnects 330, (iv) at least one interconnect from the plurality of interconnects 142, and (v) at least one solder interconnect from the plurality of solder interconnects 316.

In some implementations, the integrated device 103 is configured to be electrically coupled to the electrical device 112 through at least one electrical path that includes (i) at least one solder interconnect from the plurality of solder interconnects 350, (ii) at least one interconnect from the plurality of interconnects 122, (iii) at least one solder interconnect from the plurality of solder interconnects 360, (iv) at least one interconnect from the plurality of interconnects 142, and (v) at least one solder interconnect from the plurality of solder interconnects 316.

In some implementations, the integrated device 103 is configured to be electrically coupled to the integrated device 109 through at least one electrical path that includes (i) at least one solder interconnect from the plurality of solder interconnects 350, (ii) at least one interconnect from the plurality of interconnects 122, (iii) at least one solder interconnect from the plurality of solder interconnects 330, (iv) at least one interconnect from the plurality of interconnects 142, (v) at least one solder interconnect from the plurality of solder interconnects 320, (vi) at least one interconnect from the plurality of interconnects 172, and (vii) at least one wire bond from the plurality of wire bonds 190.

In some implementations, the integrated device 103 is configured to be electrically coupled to the integrated device 109 through at least one electrical path that includes (i) at least one solder interconnect from the plurality of solder interconnects 350, (ii) at least one interconnect from the plurality of interconnects 122, (iii) at least one solder interconnect from the plurality of solder interconnects 360, (iv) at least one interconnect from the plurality of interconnects 142, (v) at least one solder interconnect from the plurality of solder interconnects 320, (vi) at least one interconnect from the plurality of interconnects 172, and (vii) at least one wire bond from the plurality of wire bonds 190.

In some implementations, the electrical device 110 is configured to be electrically coupled to the integrated device 109 through at least one electrical path that includes (i) at least one solder interconnect from the plurality of solder interconnects 314, (ii) at least one interconnect from the plurality of interconnects 142, (ii) at least one solder interconnect from the plurality of solder interconnects 320, (iv) at least one interconnect from the plurality of interconnects 172, and (v) at least one wire bond from the plurality of wire bonds 190.

In some implementations, the electrical device 112 is configured to be electrically coupled to the integrated device 109 through at least one electrical path that includes (i) at least one solder interconnect from the plurality of solder interconnects 316, (ii) at least one interconnect from the plurality of interconnects 142, (ii) at least one solder interconnect from the plurality of solder interconnects 320, (iv) at least one interconnect from the plurality of interconnects 172, and (v) at least one wire bond from the plurality of wire bonds 190.

The configurations shown in FIGS. 1-4 provide several advantages for the package. One, positioning the electrical devices (e.g., 110, 112) in such a way that they are coupled to a bottom surface of the top substrate helps preserve the package form factor, as the electrical devices take up space that otherwise would not be used in the encapsulation layer. Thus, more capabilities and functionalities may be added and/or performance can be improved to the package, while still preserving the form factor of the package. Two, the location and the position of the electrical devices help improve signal connectivity (e.g., input/output signal connectivity) with other integrated devices (e.g., 103, 109), as the electrical devices may be located closer to the other integrated devices, thus providing shorter electrical paths between the electrical devices and the other integrated devices. Three, the location and position of the electrical devices help improve power delivery to the integrated devices of the package, since the electrical devices may be located closer to the integrated devices (e.g., 103, 109). Four, since the electrical devices are located in an encapsulation layer, it can be easily detected as to whether the electrical devices have been tampered with after fabrication of the package.

An integrated device (e.g., 103, 109) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 109) may include at least one electronic circuit (e.g., first electronic circuit, second electronic circuit, etc. . . . ). An integrated device may include transistors. An integrated device may be an example of an electrical device and/or electrical device. In some implementations, an integrated device may be a chiplet. A chiplet may be fabricated using a technology node. Different chiplets may be fabricated using different technology nodes. A technology node may refer to a specific fabrication process and/or technology that is used to fabricate an integrated device and/or a chiplet. A technology node may specify the smallest possible size that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and have higher yield loss, than a technology node that produces components (e.g., trace, transistors) with details that are less fine. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package, by optimizing which technology node to use for a particular chiplet. Thus, one chiplet may be fabricated using a first technology node, while a second chiplet may be fabricated using a second technology node. This may be the case when one chiplet does not necessarily need to be fabricated using the most advanced available technology node. In contrast, putting all of the functions of a package in one integrated device means that one technology node is used. Thus, functions that could have been fabricated using a less advanced technology node, is fabricated using a more costly technology node that potentially has a higher yield loss, which increases the overall cost of the integrated device.

In one example, an integrated device could be fabricated using a first technology node (e.g., most advanced technology node), that is configured to provide compute applications, and at least one chiplet could be fabricated using a second technology node, that is configured to provide other functionalities, where the second technology node is not as costly as the first technology node, and where the second technology node fabricates components (e.g., interconnects, traces, transistors) with minimum sizes that are greater than the minimum sizes of components (e.g., interconnects, traces, transistors) fabricated using the first technology node. An example of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

In some implementations, an integrated device (e.g., 103) may include a plurality of die interconnects comprising a first minimum spacing, and a chiplet may include a plurality of interconnects comprising a second minimum spacing. In some implementations, an integrated device (e.g., 103) may include a first plurality of transistors comprising a first minimum spacing, and a chiplet may include a second plurality of transistors comprising a second minimum spacing. In some implementations, the first minimum spacing is less than the second minimum spacing. A chiplet may include a passive device or an active device.

The package (e.g., 300, 301, 302) may be implemented in a radio frequency (RF) package. The RF package may be a radio frequency front end (RFFE) package. A package (e.g., 300, 301, 302) may be configured to provide Wireless Fidelity (WiFi) communication and/or cellular communication (e.g., 2G, 3G, 4G, 5G). The packages (e.g., 300, 301, 302) may be configured to support Global System for Mobile (GSM) Communications. Universal Mobile Telecommunications System (UMTS), and/or Long-Term Evolution (LTE). The packages (e.g., 100, 200) may be configured to transmit and receive signals having different frequencies and/or communication protocols.

Having described various interconnection die, a sequence for fabricating an interconnection die will now be described below.

Figure 5A:
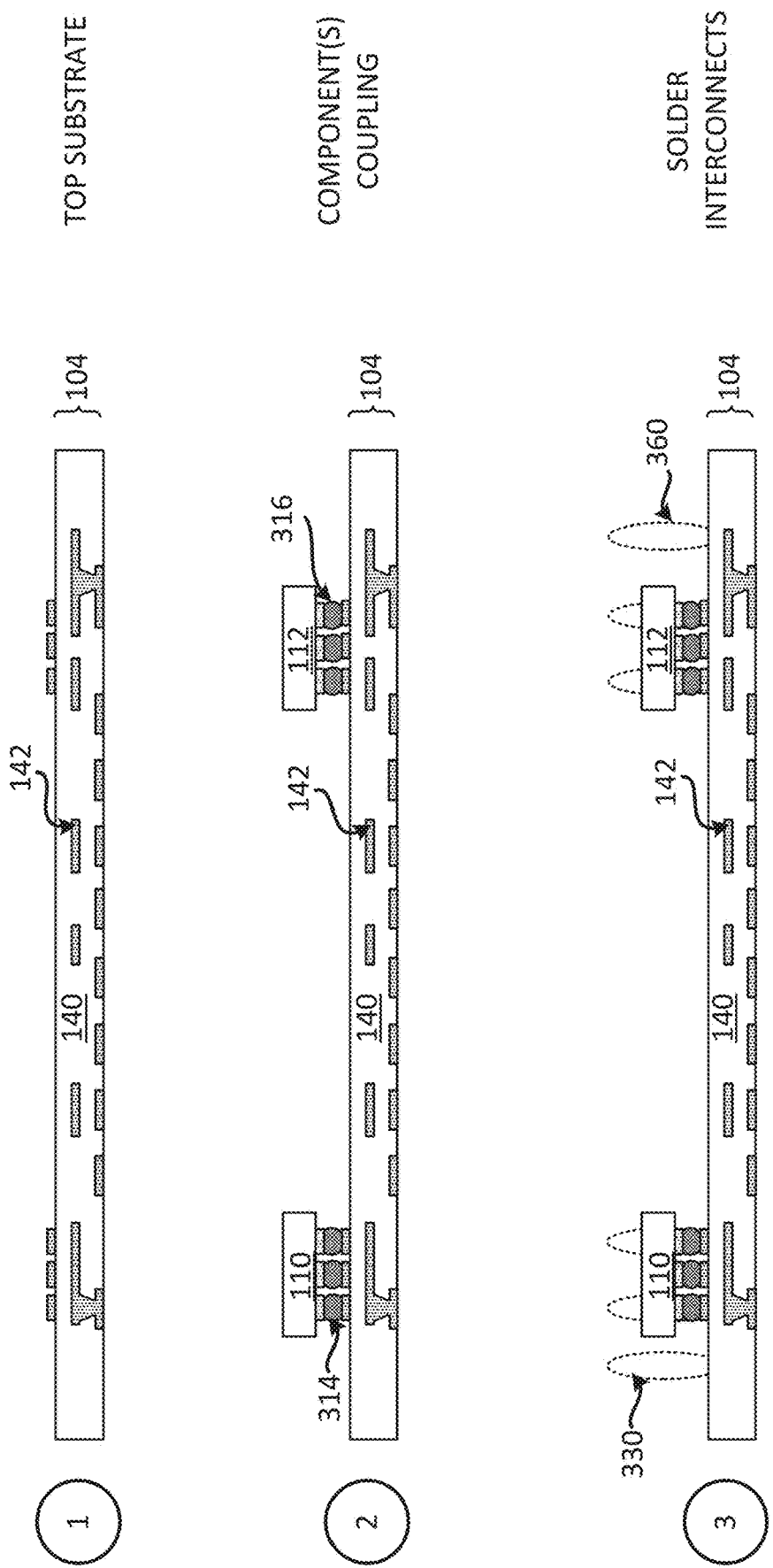
FIGS. 5A-5C illustrate an exemplary sequence for fabricating a package that includes a substrate and at least one electrical device.
Figure 5B:
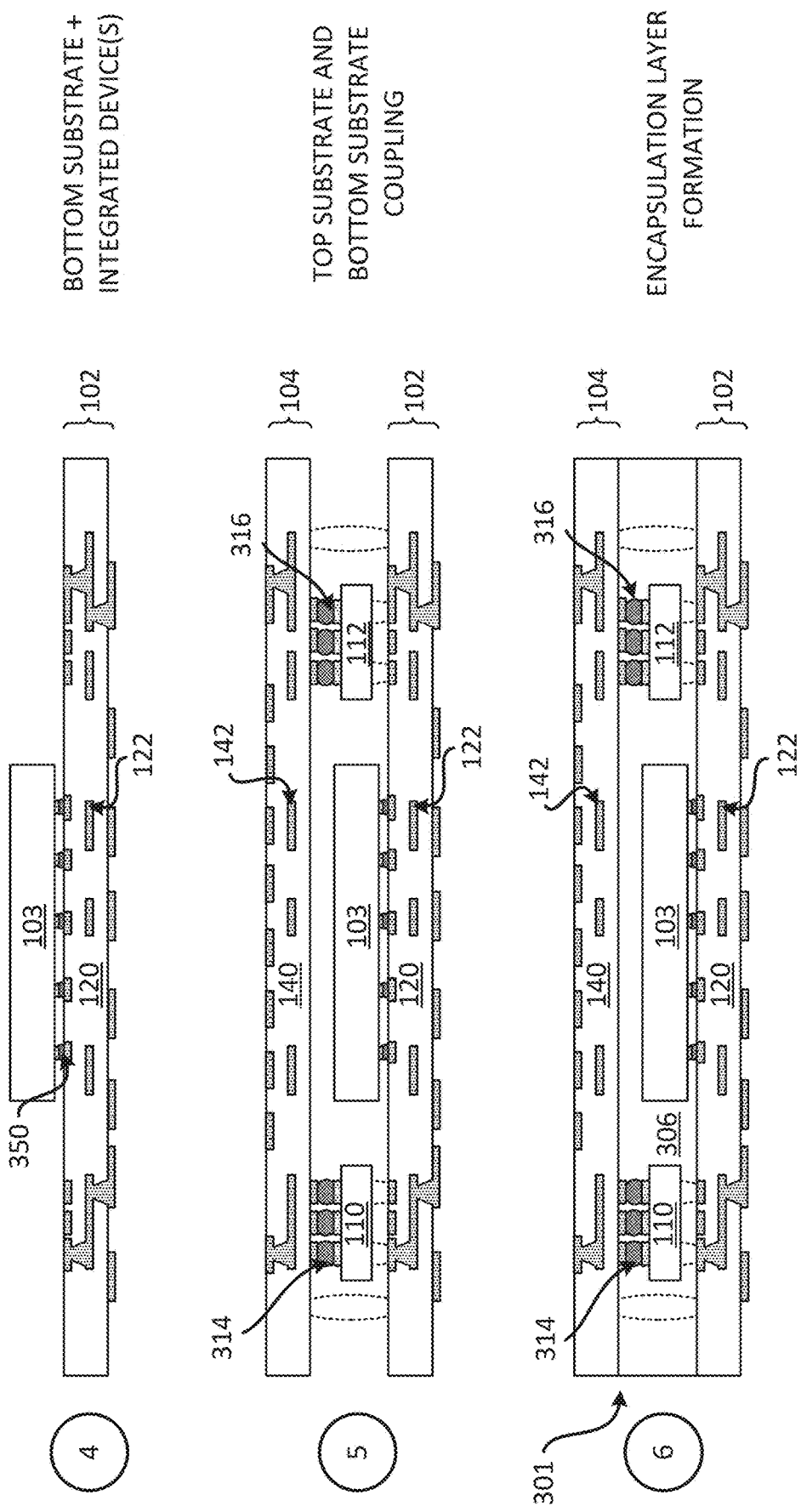
Figure 5C:
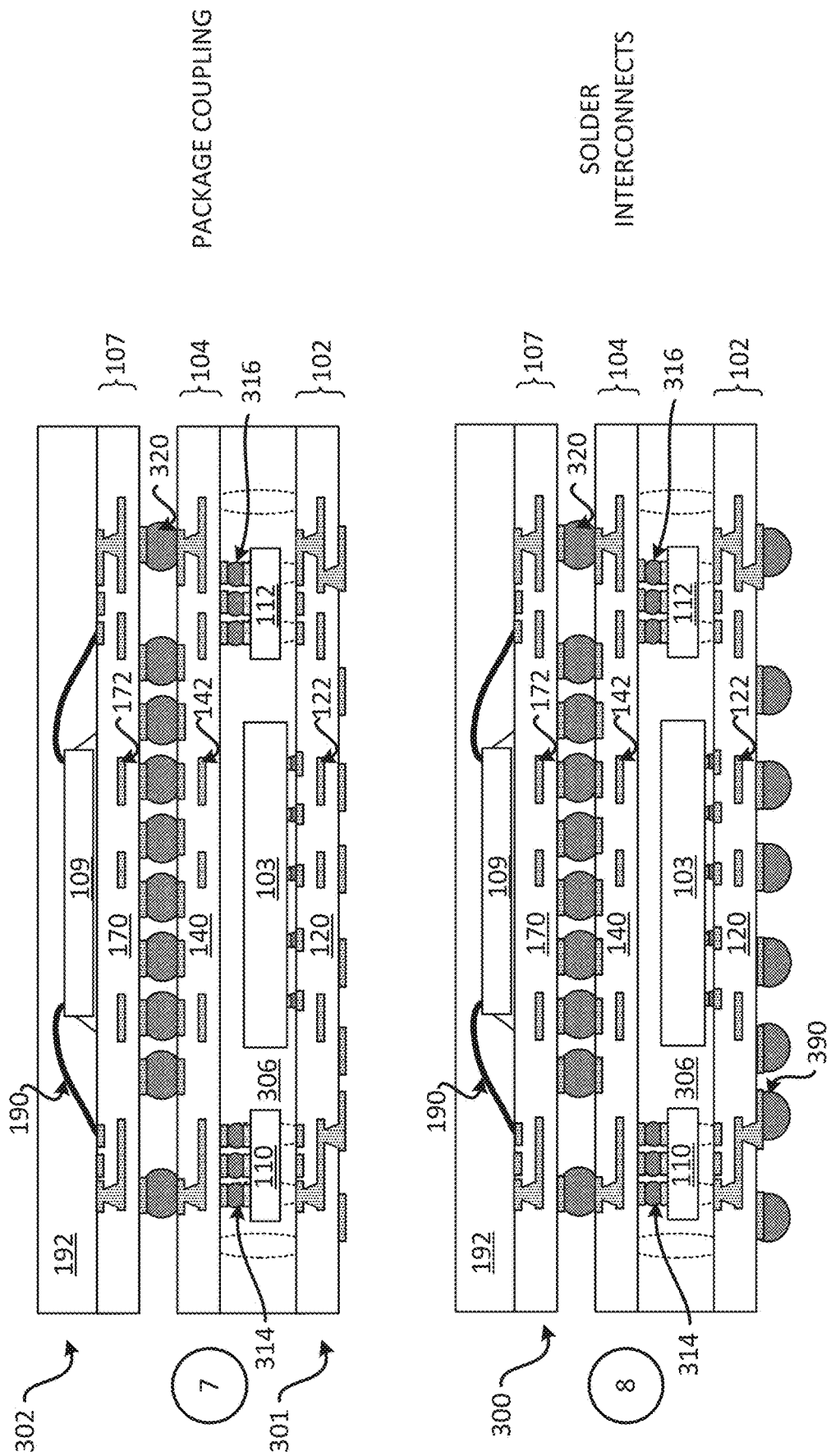

Exemplary Sequence for Fabricating a Package Comprising a Substrate and an Electrical Device In some implementations, fabricating a package includes several processes. FIGS. 5A-5C illustrate an exemplary sequence for providing or fabricating a package. In some implementations, the sequence of FIGS. 5A-5C may be used to provide or fabricate the package 300. However, the process of FIGS. 5A-5C may be used to fabricate any of the packages described in the disclosure.

It should be noted that the sequence of FIGS. 5A-5C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 5A, illustrates a state after a substrate 104 is provided. The substrate 104 includes at least one dielectric layer 140 and a plurality of interconnects 142. The substrate 104 may include a first surface (e.g., bottom surface, top surface) and a second surface (e.g., top surface, bottom surface). The substrate 104 may be fabricated using the method as described in FIGS. 7A-7B. In some implementations, a cored substrate is provided (e.g., substrate that includes a core layer).

Stage 2 illustrates a state after an electrical device 110 is coupled to the second surface (e.g., bottom surface) of the substrate 104. The electrical device 110 may be coupled to the substrate 104 through the plurality of solder interconnects 314. A solder reflow process may be used to couple the electrical device 110 to the substrate 104. Stage 2 also illustrates a state after an electrical device 112 is coupled to the second surface (e.g., bottom surface) of the substrate 104. The electrical device 112 may be coupled to the substrate 104 through the plurality of solder interconnects 316. A solder reflow process may be used to couple the electrical device 112 to the substrate 104.

Stage 3 illustrates a state after a plurality of solder interconnects 330 are coupled to the second surface (e.g., bottom surface) of the substrate 104. The plurality of solder interconnects 330 may be coupled to the plurality of interconnects 142 of the substrate 104. A solder reflow process may be used to couple the plurality of solder interconnects 330 to the substrate 104. Stage 3 also illustrates a state after a plurality of solder interconnects 360 are coupled to the second surface (e.g., bottom surface) of the substrate 104. The plurality of solder interconnects 360 may be coupled to the plurality of interconnects 142 of the substrate 104. A solder reflow process may be used to couple the plurality of solder interconnects 360 to the substrate 104.

Stage 4, as shown in FIG. 5B, illustrates a state after a substrate 102 and the integrated device 103 are provided. The substrate 102 includes at least one dielectric layer 120 and a plurality of interconnects 122. The substrate 102 may include a first surface (e.g., bottom surface, top surface) and a second surface (e.g., top surface, bottom surface). The substrate 102 may be fabricated using the method as described in FIGS. 7A-7B. In some implementations, a cored substrate is provided (e.g., substrate that includes a core layer). The integrated device 103 may be coupled to the first surface (e.g., top surface) of the substrate 102. The integrated device 103 may be coupled to the substrate 102 through the plurality of solder interconnects 350. The integrated device 103 may be coupled to the substrate 102 through a plurality of pillar interconnects and the plurality of solder interconnects 350. A solder reflow process may be used to couple the integrated device 103 to the substrate 102.

Stage 5 illustrates a state after the substrate 104 is coupled to the substrate 102 through the plurality of solder interconnects 330 and the plurality of solder interconnects 360. A solder reflow process may be used to couple the substrate 104 to the substrate 102. After the substrate 104 is coupled to the substrate 102, the integrated device 103, the electrical device 110 and the electrical device 112 may be located between the substrate 102 and the substrate 104. The substrate 104 may be configured to be electrically coupled to the substrate 102 through the plurality of solder interconnects 330 and the plurality of solder interconnects 360.

Stage 6 illustrates a state after an encapsulation layer 306 is provided between the substrate 102 and the substrate 104. The encapsulation layer 306 may encapsulate the integrated device 103, the electrical device 110 and the electrical device 112. The encapsulation layer 306 may be coupled to the first surface of the substrate 102 and the second surface of the substrate 104. The encapsulation layer 306 may include a mold, a resin and/or an epoxy. The encapsulation layer 306 may be a means for encapsulation. The encapsulation layer 306 may be provided by using a compression and transfer molding process, a sheet molding process, or a liquid molding process. Stage 6 may illustrate a package 301 as described above.

Stage 7, as shown in FIG. 5C, illustrates a state after a package 302 is coupled to the package 301. The package 302 includes the substrate 107, the integrated device 109, the plurality of wire bonds 190 and the encapsulation layer 192. The substrate 107 includes at least one dielectric layer 170 and a plurality of interconnects 172. The package 302 is coupled to the package 301 through a plurality of solder interconnects 320. A solder reflow process may be used to couple the package 302 to the package 301. The plurality of solder interconnects 320 may be coupled to the plurality of interconnects 172 of the substrate 107 and the plurality of interconnects 142 of the substrate 104.

Stage 8 illustrates a state after a plurality of solder interconnects 390 are coupled to the substrate 102. The plurality of solder interconnects 390 may be coupled to the second surface (e.g., bottom surface) of the substrate 102. A solder reflow process may be used to couple the plurality of solder interconnects 390 to the plurality of interconnects 122 of the substrate 102. Stage 8 may illustrate the package 300 that includes the package 301 and the package 302.

Figure 6:
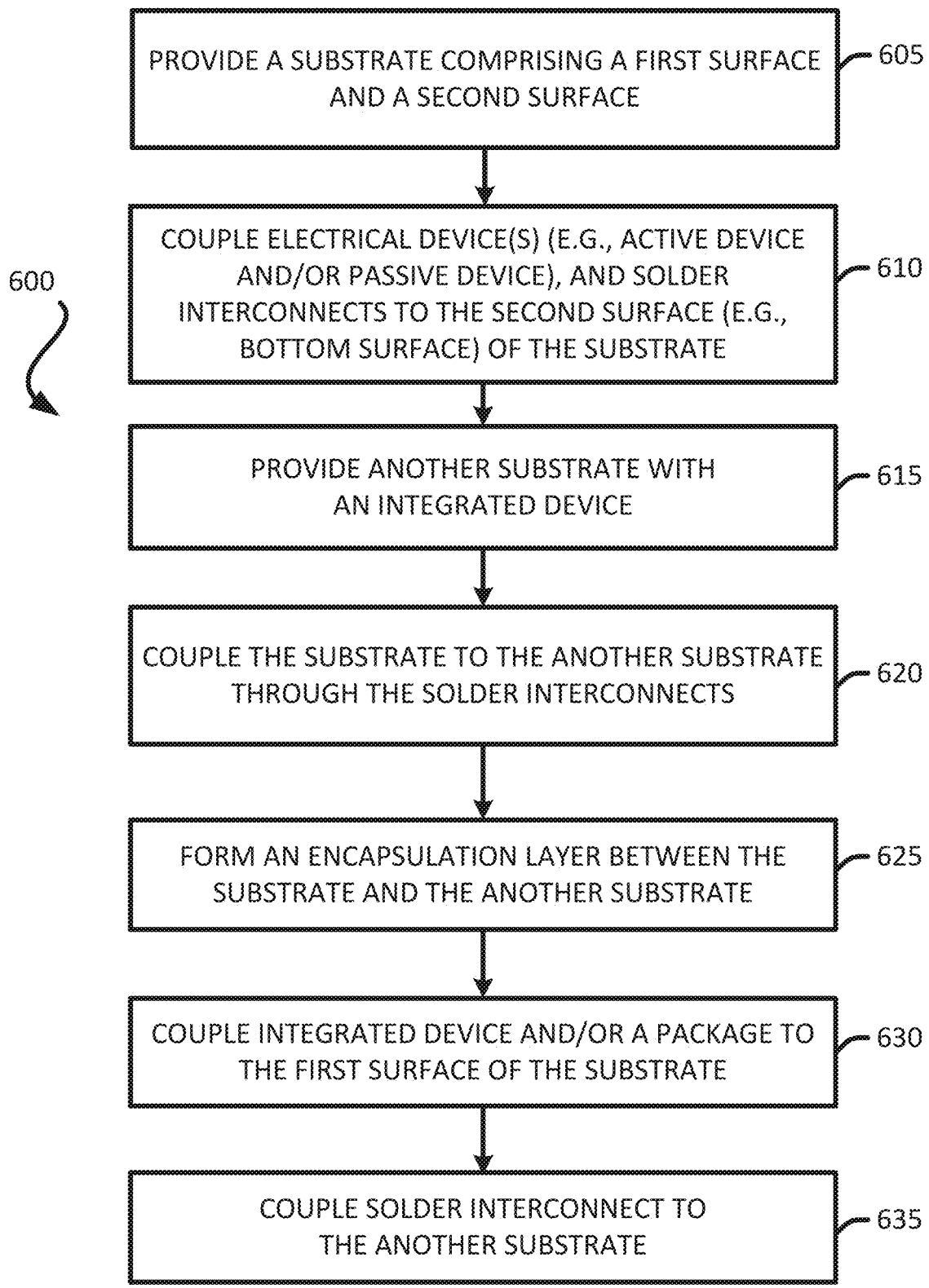
FIG. 6 illustrates an exemplary flow chart of a method for fabricating a package that includes a substrate and at least one electrical device.

Exemplary Flow Diagram of a Method for Fabricating a Package Comprising a Substrate and an Electrical Device In some implementations, fabricating a package includes several processes. FIG. 6 illustrates an exemplary flow diagram of a method 600 for providing or fabricating a package. In some implementations, the method 600 of FIG. 6 may be used to provide or fabricate the package 300 described in the disclosure. However, the method 600 may be used to provide or fabricate any of the packages described in the disclosure.

It should be noted that the method 600 of FIG. 6 may combine one or more processes in order to simplify and/or clarify the method for providing or fabricating a package. In some implementations, the order of the processes may be changed or modified.

The method provides (at 605) a substrate (e.g., 104) that includes a first surface and a second surface. The substrate 104 may be a second substrate. The substrate 104 includes at least one dielectric layer 140 and a plurality of interconnects 142. The substrate 104 may include a first surface (e.g., bottom surface, top surface) and a second surface (e.g., top surface, bottom surface). The substrate 104 may be fabricated using the method as described in FIGS. 7A-7B. In some implementations, a cored substrate is provided (e.g., substrate that includes a core layer). Stage 1 of FIG. 5A, illustrates and describes an example of a substrate with a first surface and a second surface.

The method couples (at 610) at least one electrical device and solder interconnects to the substrate. For example, the method may couple an electrical device 110, an electrical device 112 and a plurality of solder interconnects (e.g., 330, 360) to a second surface of the substrate 104. An electrical device may include a passive device and/or an active device. An electrical device may include an integrated device. An electrical device may include a passive integrated device. An electrical device may include a chiplet. An electrical device may include a trench capacitor (e.g., deep trench capacitor in a die). The electrical device 110 may be coupled to the substrate 104 through the plurality of solder interconnects 314. A solder reflow process may be used to couple the electrical device 110 to the substrate 104. The electrical device 112 may be coupled to the substrate 104 through the plurality of solder interconnects 316. A solder reflow process may be used to couple the electrical device 112 to the substrate 104.

A plurality of solder interconnects 330 may be coupled to the second surface (e.g., bottom surface) of the substrate 104. The plurality of solder interconnects 330 may be coupled to the plurality of interconnects 142 of the substrate 104. A solder reflow process may be used to couple the plurality of solder interconnects 330 to the substrate 104. A plurality of solder interconnects 360 may be coupled to the second surface (e.g., bottom surface) of the substrate 104. The plurality of solder interconnects 360 may be coupled to the plurality of interconnects 142 of the substrate 104. A solder reflow process may be used to couple the plurality of solder interconnects 360 to the substrate 104. Stages 2 and 3 of FIG. 5A, illustrate and describe an example of an electrical device and a plurality of solder interconnects coupled to a substrate.

The method provides (at 615) another substrate with an integrated device. The substrate 102 and the integrated device 103 may be provided. The substrate 102 may be a first substrate. The substrate 102 includes at least one dielectric layer 120 and a plurality of interconnects 122. The substrate 102 may include a first surface (e.g., bottom surface, top surface) and a second surface (e.g., top surface, bottom surface). The substrate 102 may be fabricated using the method as described in FIGS. 7A-7B. In some implementations, a cored substrate is provided (e.g., substrate that includes a core layer). The integrated device 103 may be coupled to the first surface (e.g., top surface) of the substrate 102. The integrated device 103 may be coupled to the substrate 102 through the plurality of solder interconnects 350. The integrated device 103 may be coupled to the substrate 102 through a plurality of pillar interconnects and the plurality of solder interconnects 350. A solder reflow process may be used to couple the integrated device 103 to the substrate 102. Stage 4 of FIG. 5B, illustrates and describes an example of providing a substrate and an integrated device.

The method couples (at 620) a substrate to another substrate. For example, the substrate 104 may be coupled to the substrate 102 through the plurality of solder interconnects 330 and the plurality of solder interconnects 360. A solder reflow process may be used to couple the substrate 104 to the substrate 102. After the substrate 104 is coupled to the substrate 102, the integrated device 103, the electrical device 110 and the electrical device 112 may be located between the substrate 102 and the substrate 104. The substrate 104 may be configured to be electrically coupled to the substrate 102 through the plurality of solder interconnects 330 and the plurality of solder interconnects 360. Stage 5 of FIG. 5B, illustrates and describes an example of coupling a substrate to another substrate.

The method forms (at 625) an encapsulation layer between the substrate and another substrate. For example, the encapsulation layer 306 may be formed between the substrate 102 and the substrate 104. The encapsulation layer 306 may encapsulate the integrated device 103, the electrical device 110 and the electrical device 112. The encapsulation layer 306 may be coupled to the first surface of the substrate 102 and the second surface of the substrate 104. The encapsulation layer 306 may include a mold, a resin and/or an epoxy. The encapsulation layer 306 may be a means for encapsulation. The encapsulation layer 306 may be provided by using a compression and transfer molding process, a sheet molding process, or a liquid molding process. Stage 6 of FIG. 5B, illustrates and describes an example of an encapsulation layer that is provided between two substrates.

The method couples (at 630) an integrated device or a package to another package. For example, the method may couple (at 630) a package 302 to a first surface of a substrate 104 of the package 301. The package 302 includes the substrate 107, the integrated device 109, the plurality of wire bonds 190 and the encapsulation layer 192. The substrate 107 includes at least one dielectric layer 170 and a plurality of interconnects 172. The package 302 is coupled to the package 301 through a plurality of solder interconnects 320. A solder reflow process may be used to couple the package 302 to the package 301. The plurality of solder interconnects 320 may be coupled to the plurality of interconnects 172 of the substrate 107 and the plurality of interconnects 142 of the substrate 104. Stage 7 of FIG. 5C, illustrates and describes a state after a package is coupled to a substrate of another package.

The method couples (at 635) a plurality of solder interconnects to a substrate of a package. For example, a plurality of solder interconnects 390 may be coupled to the second surface (e.g., bottom surface) of the substrate 102 of the package 301. A solder reflow process may be used to couple the plurality of solder interconnects 390 to the plurality of interconnects 122 of the substrate 102. Stage 8 of FIG. 5C, illustrates and describes an example of a plurality of solder interconnects coupled to a substrate.

In some implementations, several packages are fabricated at the same time on a wafer. In such cases, the method may singulate the package (e.g., 300, 301, 302).

Exemplary Sequence for Fabricating a Substrate

Figure 7A:
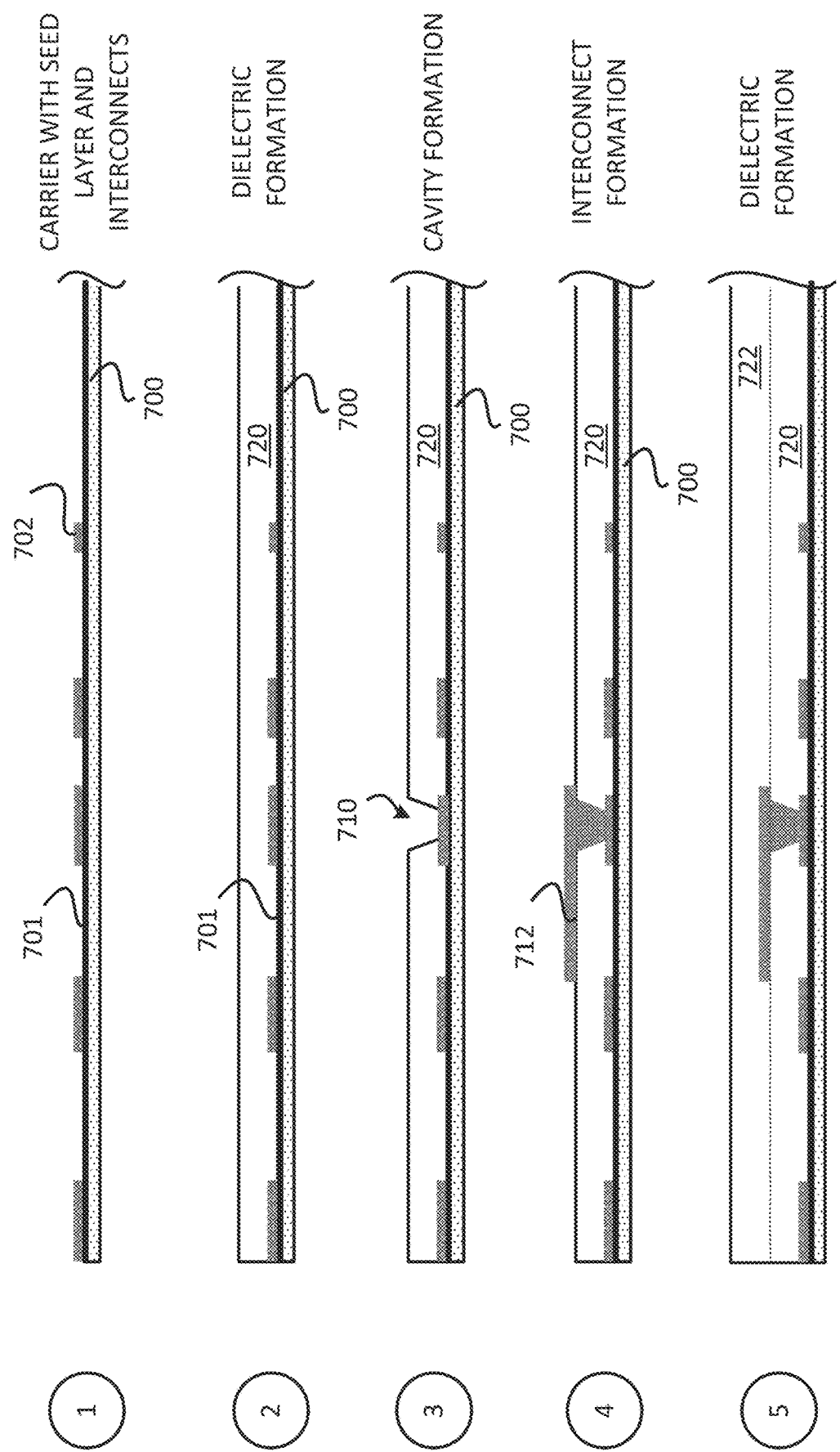
FIGS. 7A-7B illustrate an exemplary sequence for fabricating a substrate.
Figure 7B:
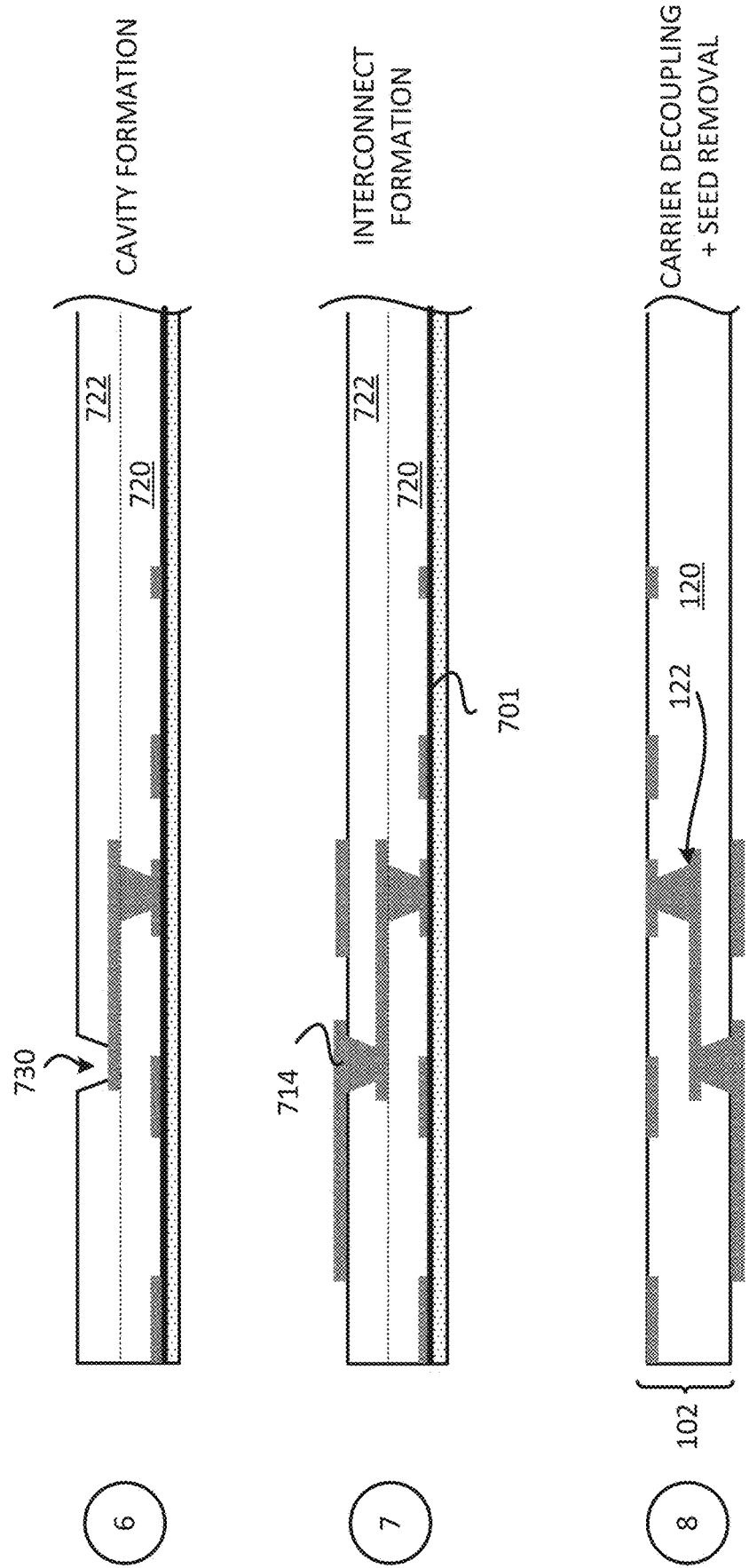

In some implementations, fabricating a substrate includes several processes. FIGS. 7A-7B illustrate an exemplary sequence for providing or fabricating a substrate. In some implementations, the sequence of FIGS. 7A-7B may be used to provide or fabricate the substrate 102. However, the process of FIGS. 7A-7B may be used to fabricate any of the substrates (e.g., 104, 107) described in the disclosure.

It should be noted that the sequence of FIGS. 7A-7B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 7A, illustrates a state after a carrier 700 is provided. A seed layer 701 and interconnects 702 may be located over the carrier 700. The interconnects 702 may be located over the seed layer 701. A plating process and etching process may be used to form the interconnects 702. In some implementations, the carrier 700 may be provided with the seed layer 701 and a metal layer that is patterned to form the interconnects 702. The interconnects 702 may represent at least some of the interconnects from the plurality of interconnects 122.

Stage 2 illustrates a state after a dielectric layer 720 is formed over the carrier 700, the seed layer 701 and the interconnects 702. A deposition and/or lamination process may be used to form the dielectric layer 720. The dielectric layer 720 may include prepreg and/or polyimide. The dielectric layer 720 may include a photo-imagable dielectric. However, different implementations may use different materials for the dielectric layer.

Stage 3 illustrates a state after a plurality of cavities 710 is formed in the dielectric layer 720. The plurality of cavities 710 may be formed using an etching process (e.g., photo etching process) or laser process.

Stage 4 illustrates a state after interconnects 712 are formed in and over the dielectric layer 720, including in and over the plurality of cavities 710. For example, a via, pad and/or traces may be formed. A plating process may be used to form the interconnects.

Stage 5 illustrates a state after a dielectric layer 722 is formed over the dielectric layer 720 and the interconnects 712. A deposition and/or lamination process may be used to form the dielectric layer 722. The dielectric layer 722 may include prepreg and/or polyimide. The dielectric layer 722 may include a photo-imagable dielectric. However, different implementations may use different materials for the dielectric layer.

Stage 6, as shown in FIG. 7B, illustrates a state after a plurality of cavities 730 is formed in the dielectric layer 722. The plurality of cavities 730 may be formed using an etching process (e.g., photo etching process) or laser process.

Stage 7 illustrates a state after interconnects 714 are formed in and over the dielectric layer 722, including in and over the plurality of cavities 730. For example, a via, pad and/or traces may be formed. A plating process may be used to form the interconnects.

Stage 8 illustrates a state after the carrier 700 is decoupled (e.g., detached, removed, grinded out) from at least one dielectric layer 120 and the seed layer 701, portions of the seed layer 701 are removed (e.g., etched out), leaving the substrate 102 that includes at least one dielectric layer 120 and the plurality of interconnects 122. The at least one dielectric layer 120 may represent the dielectric layer 720 and/or the dielectric layer 722. The plurality of interconnects 122 may represent the interconnects 702, 712 and/or 714.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

Figure 8:
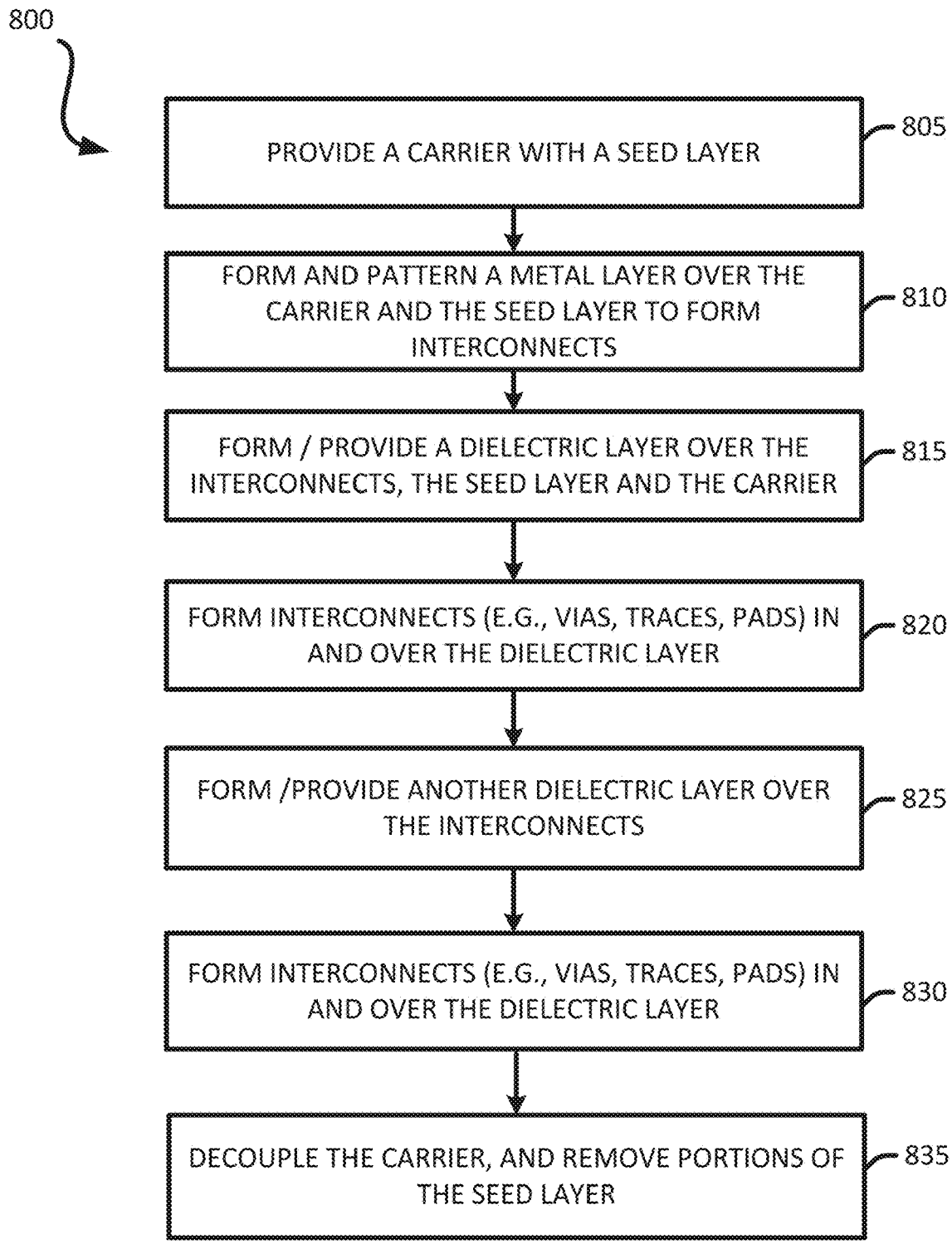
FIG. 8 illustrates an exemplary flow chart of a method for fabricating a substrate.

In some implementations, fabricating a substrate includes several processes. FIG. 8 illustrates an exemplary flow diagram of a method 800 for providing or fabricating a substrate. In some implementations, the method 800 of FIG. 8 may be used to provide or fabricate the substrate(s) of the disclosure. For example, the method 800 of FIG. 8 may be used to fabricate the substrate 102.

It should be noted that the method 800 of FIG. 8 may combine one or more processes in order to simplify and/or clarify the method for providing or fabricating a substrate. In some implementations, the order of the processes may be changed or modified.

The method provides (at 805) a carrier (e.g., 700). Different implementations may use different materials for the carrier 700. The carrier 700 may include a seed layer (e.g., 701). The seed layer 701 may include a metal (e.g., copper). The carrier may include a substrate, glass, quartz and/or carrier tape. Stage 1 of FIG. 7A illustrates and describes an example of a carrier with a seed layer that is provided.

The method forms and patterns (at 810) interconnects over the carrier 700 and the seed layer 701. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 122). Stage 1 of FIG. 7A illustrates and describes an example of forming and patterning interconnects over a seed layer and a carrier.

The method forms/provides (at 815) a dielectric layer 720 over the seed layer 701, the carrier 700 and the interconnects 702. A deposition and/or lamination process may be used to form the dielectric layer 720. The dielectric layer 720 may include prepreg and/or polyimide. The dielectric layer 720 may include a photo-imagable dielectric. Forming the dielectric layer 720 may also include forming a plurality of cavities (e.g., 710) in the dielectric layer 720. The plurality of cavities may be formed using an etching process (e.g., photo etching) or laser process. Stages 2-3 of FIG. 7A illustrate and describe an example of forming a dielectric layer and cavities in the dielectric layer.

The method forms (at 820) interconnects in and over the dielectric layer. For example, the interconnects 712 may be formed in and over the dielectric layer 720. A plating process may be used to form the interconnects. Forming interconnects may include providing a patterned metal layer over and/or in the dielectric layer. Forming interconnects may also include forming interconnects in cavities of the dielectric layer. Stage 4 of FIG. 7A illustrates and describes an example of forming interconnects in and over a dielectric layer.

The method forms/provides (at 825) a dielectric layer 722 over the dielectric layer 720 and the interconnects 712. A deposition and/or lamination process may be used to form the dielectric layer 722. The dielectric layer 722 may include prepreg and/or polyimide. The dielectric layer 722 may include a photo-imagable dielectric. Forming the dielectric layer 722 may also include forming a plurality of cavities (e.g., 730) in the dielectric layer 722. The plurality of cavities may be formed using an etching process (e.g., photo etching) or laser process. Stages 5-6 of FIGS. 7A-7B illustrate and describe an example of forming a dielectric layer and cavities in the dielectric layer.

The method forms (at 830) interconnects in and over the dielectric layer. For example, the interconnects 714 may be formed in and over the dielectric layer 722. A plating process may be used to form the interconnects. Forming interconnects may include providing a patterned metal layer over and/or in the dielectric layer. Forming interconnects may also include forming interconnects in cavities of the dielectric layer. Stage 7 of FIG. 7B illustrates and describes an example of forming interconnects in and over a dielectric layer.

The method decouples (at 835) the carrier (e.g., 700) from the seed layer (e.g., 701). The carrier 700 may be detached and/or grinded off. The method may also remove (at 835) portions of the seed layer (e.g., 701). An etching process may be used to remove portions of the seed layer 701. Stage 8 of FIG. 7B illustrates and describes an example of decoupling a carrier and seed layer removal.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 9:
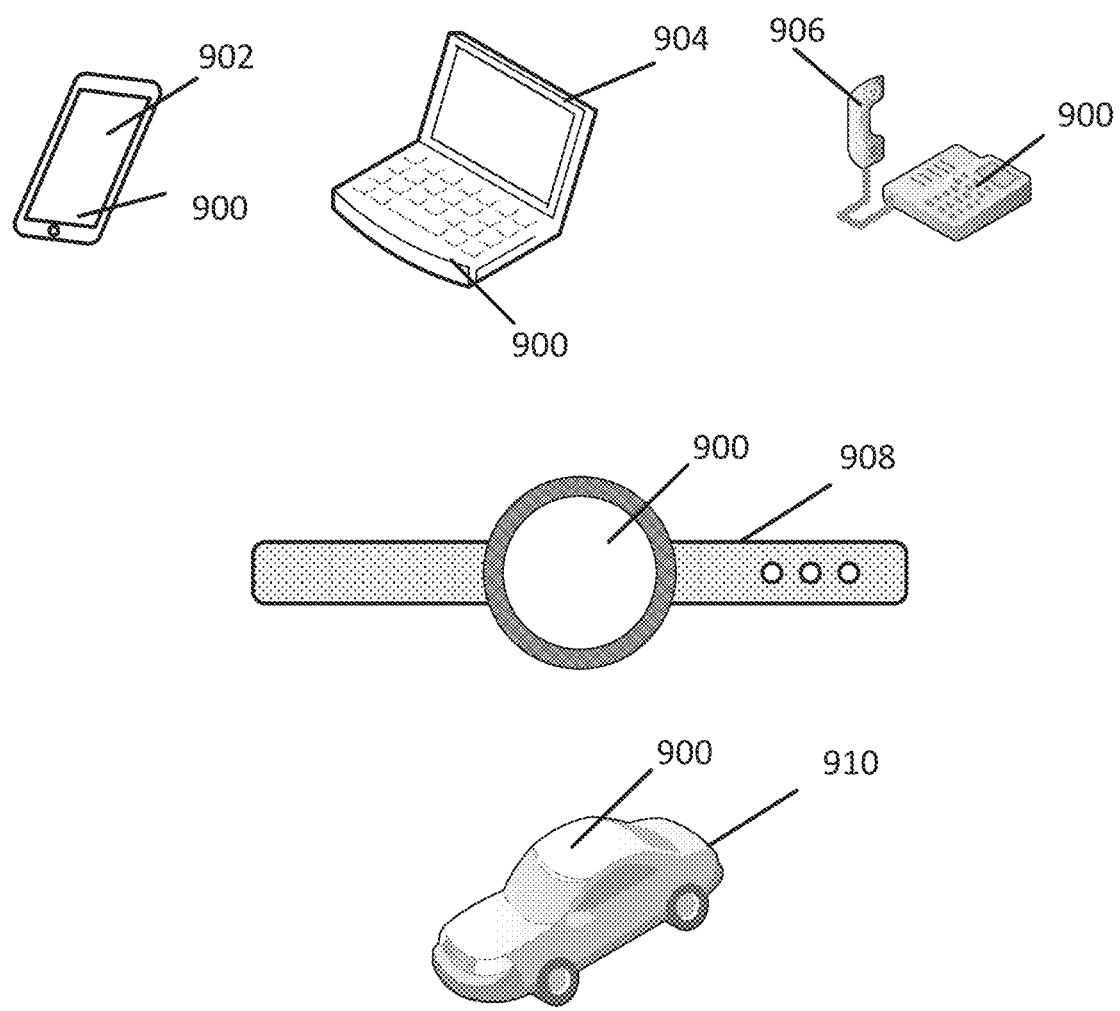
FIG. 9 illustrates various electronic devices that may integrate a die, an electronic circuit, an integrated device, an integrated passive device (IPD), a passive component, a package, and/or a device package described herein.

FIG. 9 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 902, a laptop computer device 904, a fixed location terminal device 906, a wearable device 908, or automotive vehicle 910 may include a device 900 as described herein. The device 900 may be, for example, any of the devices and/or integrated circuit (IC) packages described herein. The devices 902, 904, 906 and 908 and the vehicle 910 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5C, 6, 7A-7B, and 8-9 may be rearranged and/or combined into a single component, process, feature or function or embodied in several components, processes, or functions. Additional elements, components, processes, and/or functions may also be added without departing from the disclosure. It should also be noted FIGS. 1-4, 5A-5C, 6, 7A-7B, and 8-9 and its corresponding description in the present disclosure is not limited to dies and/or ICs. In some implementations, FIGS. 1-4, 5A-5C, 6, 7A-7B, and 8-9 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package comprising a first substrate; a first integrated device coupled to the first substrate; a second substrate coupled to the first substrate through a first plurality of solder interconnects such that the first integrated device is located between the first substrate and the second substrate, wherein the second substrate includes a first surface and a second surface; an electrical device coupled to the second surface of the second substrate such that the electrical device is located between the first substrate and the second substrate; and an encapsulation layer coupled to the first substrate and the second substrate. The encapsulation layer is located between the first substrate and the second substrate. The encapsulation layer encapsulates the first integrated device and the electrical device.

Aspect 2: The package of aspect 1, wherein the electrical device includes a passive device or an active device.

Aspect 3: The package of aspects 2, wherein the passive device includes an inductor or a capacitor.

Aspect 4: The package of aspects 2 through 3, wherein the passive device includes a silicon die.

Aspect 5: The package of aspects 2 through 4, wherein the passive device includes a trench capacitor.

Aspect 6: The package of aspects 1 through 5, wherein the electrical device includes a second integrated device.

Aspect 7: The package of aspects 1 through 6, wherein the electrical device is configured to be electrically coupled to the first integrated device through an electrical path that includes at least one interconnect from the second substrate, at least one solder interconnect from the first plurality of solder interconnects and at least one interconnect from the first substrate.

Aspect 8: The package of aspects 1 through 7, further comprising a second electrical device coupled to the second surface of the second substrate, wherein the second electrical device is configured to be electrically coupled to the first integrated device through a second electrical path that includes at least one second interconnect from the second substrate, at least one second solder interconnect from the first plurality of solder interconnects and at least one second interconnect from the first substrate.

Aspect 9: The package of aspects 1 through 8, wherein the electrical device is coupled to the second surface of the second substrate through a second plurality of solder interconnects.

Aspect 10: The package of aspects 1 through 9, wherein the package is a package on package (PoP).

Aspect 11: A package comprising a first substrate; a first integrated device coupled to the first substrate; a second substrate coupled to the first substrate through a first plurality of solder interconnects such that the first integrated device is located between the first substrate and the second substrate, wherein the second substrate includes a first surface and a second surface; a passive device coupled to the second surface of the second substrate such that the passive device is located between the first substrate and the second substrate; and an encapsulation layer coupled to the first substrate and the second substrate. The encapsulation layer is located between the first substrate and the second substrate. The encapsulation layer encapsulates the first integrated device and the passive device.

Aspect 12: The package of aspect 11, wherein the passive device includes a trench capacitor.

Aspect 13: The package of aspects 11 through 12, wherein the passive device includes a silicon die.

Aspect 14: The package of aspects 11 through 13, wherein the passive device is configured to be electrically coupled to the first integrated device through an electrical path that includes at least one interconnect from the second substrate, at least one solder interconnect from the first plurality of solder interconnects and at least one interconnect from the first substrate.

Aspect 15: The package of aspects 11 through 14, further comprising a second passive device coupled to the second surface of the second substrate, wherein the second passive device is configured to be electrically coupled to the first integrated device through a second electrical path that includes at least one second interconnect from the second substrate, at least one second solder interconnect from the first plurality of solder interconnects and at least one second interconnect from the first substrate.

Aspect 16: The package of aspects 11 through 15, further comprising an active device coupled to the second surface of the second substrate, wherein the active device is configured to be electrically coupled to the first integrated device through a second electrical path that includes at least one second interconnect from the second substrate, at least one second solder interconnect from the first plurality of solder interconnects and at least one second interconnect from the first substrate.

Aspect 17: The package of aspects 11 through 16 wherein the package is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 18: A package comprising a first substrate; a first integrated device coupled to the first substrate; a second substrate coupled to the first substrate through a first plurality of solder interconnects such that the first integrated device is located between the first substrate and the second substrate, wherein the second substrate includes a first surface and a second surface; a second integrated device coupled to the second surface of the second substrate such that the second integrated device is located between the first substrate and the second substrate; and an encapsulation layer coupled to the first substrate and the second substrate. The encapsulation layer is located between the first substrate and the second substrate. The encapsulation layer encapsulates the first integrated device and the second integrated device.

Aspect 19: The package of aspect 18, wherein the second integrated device is configured to be electrically coupled to the first integrated device through an electrical path that includes at least one interconnect from the second substrate, at least one solder interconnect from the first plurality of solder interconnects and at least one interconnect from the first substrate.

Aspect 20: A method for fabricating a package. The method provides a second substrate that includes a first surface and a second surface. The method couples an electrical device to the second surface of the second substrate. The method couples a first plurality of solder interconnects to the second surface of the second substrate. The method provides a first substrate and a first integrated device coupled to the first substrate. The method couples the second substrate to the first substrate through the first plurality of solder interconnects such that the first integrated device and the electrical device are located between the first substrate and the second substrate. The method forms an encapsulation layer between the first substrate and the second substrate.

Aspect 21: The method of aspect 20, wherein the electrical device includes a passive device or an active device.

Aspect 22: The method of aspect 20, wherein the electrical device includes a second integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a first substrate;
   a first integrated device coupled to the first substrate;
   a second substrate coupled to the first substrate through a first plurality of solder interconnects such that the first integrated device is located between the first substrate and the second substrate,
      wherein the second substrate includes a first surface and a second surface, and
      wherein the second substrate includes:
         a plurality of interconnects; and
         at least one plane interconnect configured to provide at least one electrical path for ground,
            wherein the at least one plane interconnect has a width and a length,
            wherein the width of the at least one plane interconnect is less than the length of the at least one plane interconnect, and
            wherein the width of the at least one plane interconnect is greater than a width of any single trace interconnect from the plurality of interconnects of the second substrate;
   an electrical device coupled to the second surface of the second substrate such that the electrical device is located between the first substrate and the second substrate; and
   an encapsulation layer coupled to the first substrate and the second substrate,
      wherein the encapsulation layer is located between the first substrate and the second substrate, and
      wherein the encapsulation layer encapsulates the first integrated device and the electrical device.

2. The package of claim 1, wherein the electrical device includes a passive device or an active device.

3. The package of claim 2, wherein the passive device includes an inductor or a capacitor.

4. The package of claim 2, wherein the passive device includes a silicon die.

5. The package of claim 2, wherein the passive device includes a trench capacitor.

6. The package of claim 1, wherein the electrical device includes a second integrated device.

7. The package of claim 1, wherein the electrical device is configured to be electrically coupled to the first integrated device through an electrical path that includes at least one interconnect from the second substrate, at least one solder interconnect from the first plurality of solder interconnects and at least one interconnect from the first substrate.

8. The package of claim 1, further comprising a second electrical device coupled to the second surface of the second substrate, wherein the second electrical device is configured to be electrically coupled to the first integrated device through a second electrical path that includes at least one second interconnect from the second substrate, at least one second solder interconnect from the first plurality of solder interconnects and at least one second interconnect from the first substrate.

9. The package of claim 1, wherein the electrical device is coupled to the second surface of the second substrate through a second plurality of solder interconnects.

10. The package of claim 1, wherein the package is a package on package (PoP).

11. A package comprising:
a first substrate;
a first integrated device coupled to the first substrate;
a second substrate coupled to the first substrate through a first plurality of solder interconnects such that the first integrated device is located between the first substrate and the second substrate,
wherein the second substrate includes a first surface and a second surface, and
wherein the second substrate includes:
a plurality of interconnects; and
a plane interconnect configured to provide at least one electrical path for ground,
wherein the plane interconnect has a length that is greater than a length of any single trace interconnect from the plurality of interconnects of the second substrate,
wherein the plane interconnect has a width that is greater than a width of any single trace interconnect from the plurality of interconnects of the second substrate,
wherein the plurality of interconnects of the second substrate includes trace interconnects configured to provide an electrical path for signal and/or an electrical path for power;
a passive device coupled to the second surface of the second substrate such that the passive device is located between the first substrate and the second substrate; and
an encapsulation layer coupled to the first substrate and the second substrate,
wherein the encapsulation layer is located between the first substrate and the second substrate, and
wherein the encapsulation layer encapsulates the first integrated device and the passive device.

12. The package of claim 11, wherein the passive device includes a trench capacitor.

13. The package of claim 11, wherein the passive device includes a silicon die.

14. The package of claim 11, wherein the passive device is configured to be electrically coupled to the first integrated device through an electrical path that includes at least one interconnect from the second substrate, at least one solder interconnect from the first plurality of solder interconnects and at least one interconnect from the first substrate.

15. The package of claim 11, further comprising a second passive device coupled to the second surface of the second substrate, wherein the second passive device is configured to be electrically coupled to the first integrated device through a second electrical path that includes at least one second interconnect from the second substrate, at least one second solder interconnect from the first plurality of solder interconnects and at least one second interconnect from the first substrate.

16. The package of claim 11, further comprising an active device coupled to the second surface of the second substrate, wherein the active device is configured to be electrically coupled to the first integrated device through a second electrical path that includes at least one second interconnect from the second substrate, at least one second solder interconnect from the first plurality of solder interconnects and at least one second interconnect from the first substrate.

17. The package of claim 11 wherein the package is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

18. A package comprising:
a first substrate;
a first integrated device coupled to the first substrate;
a second substrate coupled to the first substrate through a first plurality of solder interconnects such that the first integrated device is located between the first substrate and the second substrate,
wherein the second substrate includes a first surface and a second surface, and
wherein the second substrate includes:
a plurality of interconnects; and
a plane interconnect configured to provide at least one electrical path for ground,
wherein the plane interconnect has a width and a length,
wherein the width of the plane interconnect is less than the length of the at least one plane interconnect, and
wherein the length of the plane interconnect is greater than a length of any single trace interconnect from the plurality of interconnects of the second substrate;
a second integrated device coupled to the second surface of the second substrate such that the second integrated device is located between the first substrate and the second substrate; and
an encapsulation layer coupled to the first substrate and the second substrate,
wherein the encapsulation layer is located between the first substrate and the second substrate, and
wherein the encapsulation layer encapsulates the first integrated device and the second integrated device.

19. The package of claim 18, wherein the second integrated device is configured to be electrically coupled to the first integrated device through an electrical path that includes at least one interconnect from the second substrate, at least one solder interconnect from the first plurality of solder interconnects and at least one interconnect from the first substrate.

20. A method for fabricating a package, comprising:
providing a second substrate that includes a first surface and a second surface, wherein the second substrate includes:
  a plurality of interconnects; and
  at least one plane interconnect configured to provide at least one electrical path for ground,
  wherein the at least one plane interconnect has a length that is greater than a length of any single trace interconnect from the plurality of interconnects of the second substrate, and
  wherein the at least one plane interconnect has a width that is greater than a width of any single trace interconnect from the plurality of interconnects of the second substrate;
coupling an electrical device to the second surface of the second substrate;
coupling a first plurality of solder interconnects to the second surface of the second substrate;
providing a first substrate and a first integrated device coupled to the first substrate;
coupling the second substrate to the first substrate through the first plurality of solder interconnects such that the first integrated device and the electrical device are located between the first substrate and the second substrate, wherein the first integrated device vertically overlaps with the at least one plane interconnect; and
forming an encapsulation layer between the first substrate and the second substrate.

21. The method of claim 20, wherein the electrical device includes a passive device or an active device.

22. The method of claim 20, wherein the electrical device includes a second integrated device.

* * * * *